United States Patent [19]

Flatscher et al.

[11] Patent Number: 4,632,059

[45] Date of Patent: Dec. 30, 1986

[54] EVAPORATOR DEVICE FOR THE EVAPORATION OF SEVERAL MATERIALS

[75] Inventors: Georg Flatscher, Schneizlreuth; Anton Beckerbauer, Nussdorf, both of Fed. Rep. of Germany

[73] Assignee: Dr. Johannes Heidenhain GmbH, Traunreut, Fed. Rep. of Germany

[21] Appl. No.: 773,517

[22] Filed: Sep. 5, 1985

Related U.S. Application Data

[63] Continuation of Ser. No. 605,866, May 1, 1984, abandoned.

[30] Foreign Application Priority Data

May 6, 1983 [DE] Fed. Rep. of Germany ....... 3316554

[51] Int. Cl.[4] ............................................ C23C 16/00
[52] U.S. Cl. .................................... 118/727; 118/730; 219/121 EE; 219/121 EX; 219/271; 219/275; 427/42; 427/250
[58] Field of Search ....................... 118/727, 726, 730; 427/42, 250; 219/271, 275, 121 EE, 121 EX

[56] References Cited

U.S. PATENT DOCUMENTS

| | | | |
|---|---|---|---|
| 2,482,329 | 9/1949 | Dimmick | 118/727 |
| 3,227,133 | 1/1966 | Anderson et al. | 118/727 X |
| 3,625,180 | 12/1971 | Smith et al. | |
| 3,684,557 | 8/1972 | Kienel | 427/42 |
| 3,695,217 | 10/1972 | Jacobsson | 118/727 |
| 3,801,356 | 4/1974 | Mulfinger et al. | 427/42 |
| 4,048,462 | 9/1977 | Hill et al. | 219/121 EE |
| 4,108,107 | 8/1978 | Scheuermann | 118/730 |

FOREIGN PATENT DOCUMENTS

| | | |
|---|---|---|
| 1934217 | 6/1971 | Fed. Rep. of Germany ........ 427/42 |
| 2650215 | 7/1978 | Fed. Rep. of Germany . |
| 3010925 | 10/1982 | Fed. Rep. of Germany . |
| 1318046 | 5/1973 | United Kingdom . |

*Primary Examiner*—Bernard D. Pianalto
*Attorney, Agent, or Firm*—Willian Brinks Olds Hofer Gilson & Lione Ltd.

[57] ABSTRACT

An evaporator device system having an electron jet heating device for the vaporization of several materials onto a substrate in a vacuum chamber includes at least two crucibles for the reception of respective evaporation materials. These crucibles are concentrically arranged on a turntable. For the more uniform evaporation of the material, at least the crucible aligned with the electron jet is caused to rotate in the turntable during operation of the eletron jet heating device.

1 Claim, 2 Drawing Figures

EVAPORATOR DEVICE FOR THE EVAPORATION OF SEVERAL MATERIALS

This application is a continuation of application Ser. No. 605,866, filed May 1, 1984, now abandoned.

BACKGROUND OF THE INVENTION

The present invention relates to an evaporator device of the type having a turntable, at least two crucibles arranged concentrically on the turntable, each containing a respective material to be to be vaporized, and means for jet heating the materials in the crucibles.

U.S. Pat. No. 2,482,329 discloses a prior art evaporator system in which several recesses are arranged concentrically to one another on a rotatable, circular disc. Each of these recesses serves to receive a respective material to be evaporated or vaporized. The circular disc is rotatable stepwise in order to align a selected one of the recesses with a single heating source.

British Pat. No. 1,318,046 discloses an evaporator system which includes a turntable having concentric grooves for the reception of vaporization materials. An electron jet source is used to heat the vaporization material to evaporation temperatures in closely bounded zones which can be regarded in some respects as crucibles.

West German DE-OS No. 30 10 925 discloses an evaporator system which includes a turntable with concentrically arranged, milled in crucibles for the reception of several vaporization materials. These crucibles are aligned selectively with a single electron jet source for heating the materials contained in the crucibles.

West German DE-OS No. 26 50 215 discloses a system in which the material being evaporated is caused to rotate in order to provide more uniform evaporation.

SUMMARY OF THE INVENTION

The present invention is directed to an improved evaporator device of the general type described above, in which a variety of vaporization materials can be applied in reproducible layer thicknesses to at least one substrate.

According to this invention, an evaporator device of the type described initially above is provided with means for rotatably positioning the crucibles on the turntable such that each crucible is rotatable about a respective axis. Means are also provided for rotating at least one of the crucibles about the respective axis during heating of the material in the crucible by the jet heating means.

The present invention provides the important advantage that only a single jet heating device is required to heat several materials that can be applied to at least one substrate without intermediate ventilation of the vacuum chamber. In this way, the time and cost of operation can be considerably reduced, and the rejection rate can be substantially reduced as well. This is because the thickness of layers on the substrate can be formed reproducibly, and undesired contaminants often encountered during intermediate ventilation of the vacuum chamber are avoided.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
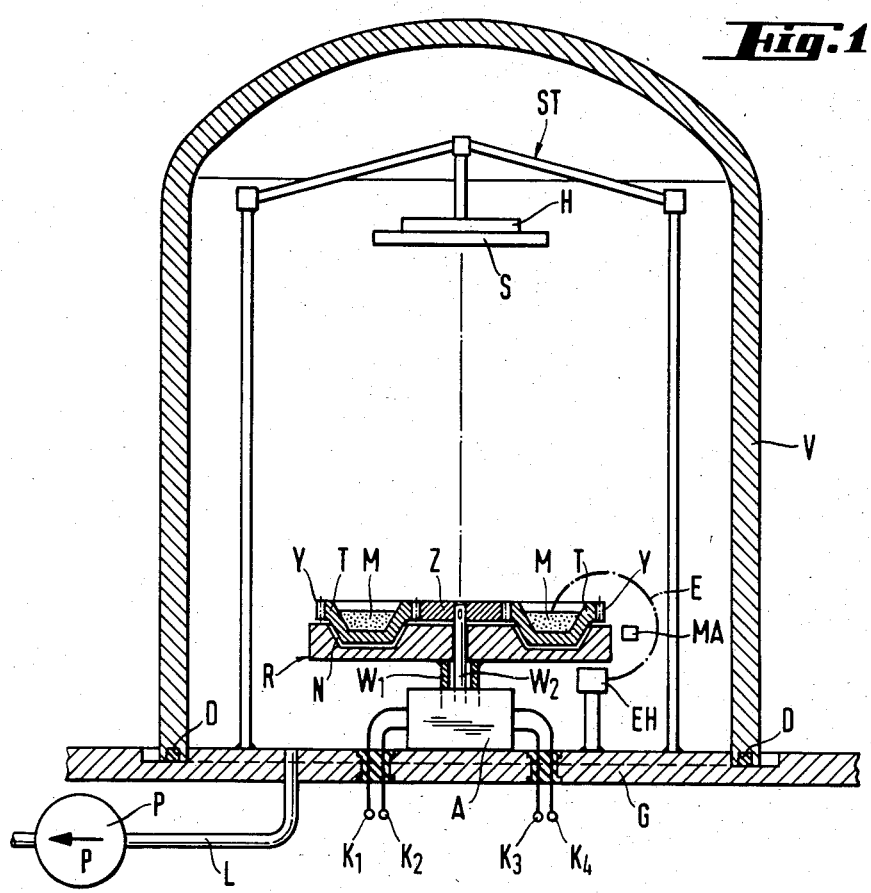
FIG. 1 is a cross-sectional view of a vapor deposition system including a vacuum chamber, which system incorporates a presently preferred embodiment of this invention.

Turning now to the drawings, FIG. 1 shows a cross-sectional view of an evaporator arrangment which defines a vacuum chamber. This vapor deposition system includes a base plate G on which is arranged a vacuum hood V. A seal D is interposed between the plate G and the hood V in order to create a vacuum-tight seal. The vacuum hood V and the plate G cooperate to form a vacuum chamber which is connected via a suction line L with a vacuum pump P. A holder H is suspended on a stand ST within the interior of the vacuum chamber. The underside of this holder H serves to support a substrate S. The underside of the substrate S is to be vapor treated successively with several materials M.

The base plate G serves further to mount a drive unit A centrally within the vacuum chamber. This drive unit A rotatably positions an outer vertical hollow shaft $W_1$, which serves to support and rotate a turntable R. The turntable R serves to support four concentrically arranged crucibles T, each of which serves to receive a respective vaporizing treatment material M. Underneath the turntable R there is arranged at its periphery an electron jet heating device EH which is mounted to the base plate G. The electron jet heating device EH generates an electron jet E which travels on a curved path under the influence of a magnetic deflecting device MA and impinges on the surface of the material M to be evaporated in one of the crucibles T.

Figure 2:
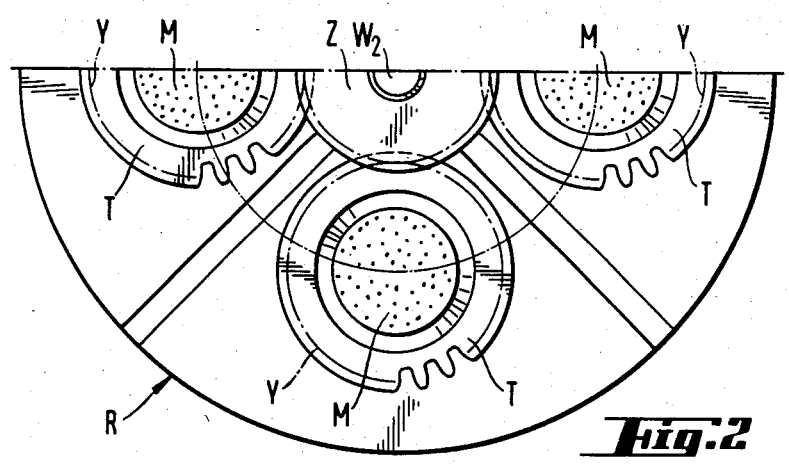
FIG. 2 shows a plan view of the turntable of the embodiment of FIG. 1.

The four crucibles T are rotatably mounted in recesses N defined by the turntable R. Each of the crucibles T defines an outside crucible gear Y as shown in FIG. 2. An inner shaft $W_2$ is rotatably mounted within the outer hollow shaft $W_1$ and serves to rotate a drive gear Z. This drive gear Z engages the crucible gears Y at the level of the turntable in order to rotate the crucibles T about their respective axes of rotation. During the evaporation process, the crucibles T rotate at a selectable constant angular velocity. For this reason, the evaporation material M of a crucible T aligned with the electron jet E is more uniformly evaporated. In this way, a layer of reproduceable thickness can be applied to the substrate S and the rate of rejection can be substantially reduced. Furthermore, this uniform evaporation causes a considerably greater portion of the evaporation material M to be evaporated from the crucible T. This is because crater formation in the surface of the evaporating material M (which frequently occurs in the case of a stationary crucible) is largely avoided.

When it is desired to evaporate other evaporation materials M in the other crucibles T, the turntable R is rotated until the desired crucibles T are successively aligned with the electron jet E. In this way, the successive application of various materials M to the substrate S can be accomplished without intermediate ventilation of the vacuum chamber. The control of the drive unit A for the alignment of a selected one of the crucibles T with the electron jet E is accomplished via signals applied on electrical conductors $K_1, K_2$. The electrical conductors $K_3, K_4$ are used to provide current for the rotation of the crucibles T about their respective axes. The electrical conductors $K_1-K_4$ pass out of the base plate G in a sealed, vacuum tight manner so as not to interfere with the vapor deposition process.

Of course, it should be understood that a wide range of changes and modifications can be made to the preferred embodiment described above. For example, in a manner not shown, it is also possible for only the crucible currently aligned with the electron jet to be rotated. It is therefore intended the foregoing detailed description be regarded as illustrative rather than limiting, and that it be understood that it is the following claims, including all equivalents, which are intended to define the scope of this invention.

We claim:

1. In an evaporator device of the type comprising a turntable and a jet heating device, the improvement comprising:

a hollow shaft which rotatably supports the turntable for rotation about a table axis;

a plurality of crucibles positioned on the turntable equidistant from the table axis, each positioned for rotation with respect to the turntable about a respective crucible axis, each of said crucible axes extending through the respective crucible, each of the crucible axes being spaced from and noncoincident with the table axis;

a plurality of crucible gears, each secured to a respective one of the crucibles so as to be concentric with the respective crucible axis;

a drive shaft positioned within the hollow shaft;

a drive gear secured to the drive shaft and engaged with the crucible gears such that rotation of the drive shaft causes each of the crucibles to rotate about the respective crucible axis; and means for rotating the drive shaft to rotate the crucibles during operation of the jet heating device in order to obtain improved vaporization of materials contained in the crucibles;

means for rotating the hollow shaft to index the turntable to bring selected ones of the crucibles into alignment with the jet heating device, said jet heating device positioned outside of the crucibles such that rotation of the turntable successively brings each of the crucibles into alignemnt with the jet heating device;

wherein each of the crucibles is circular and is positioned on the turntable not to overlap the table axis;

wherein the turntable defines a planar upper surface which defines a plurality of frusto-conical recesses;

wherein each of the crucibles defines a respective frusto-conical lower surface positioned within a respective one of the recesses, said frusto-conical lower surfaces shaped to rotate freely within the respective recesses such that the recesses of the turntable both hold the crucibles in position and guide the crucibles in rotation;

wherein the drive gear is positioned adjacent the upper surface of the turntable, centered among the crucibles; and wherein each of the crucible gears is exposed upwardly.

* * * * *